CONSTANT-CURRENT TRANSISTOR CIRCUITS

Filed July 24, 1967

2 Sheets-Sheet 1

INVENTOR
Herbert Stopper
BY Spencer & Kaye
ATTORNEYS

CONSTANT-CURRENT TRANSISTOR CIRCUITS

Filed July 24, 1967 2 Sheets-Sheet 2

INVENTOR
Herbert Stopper
BY Spencer & Kaye
ATTORNEY

United States Patent Office 3,539,834

Patented Nov. 10, 1970

3,539,834

CONSTANT-CURRENT TRANSISTOR CIRCUITS

Herbert Stopper, Litzelstetten, Germany, assignor to Telefunken, Patentverwertungegesellschaft m.b.H., Ulm, Danube, Germany Filed July 24, 1967, Ser. No. 655,464
Claims priority, application Germany, July 26, 1966, T 31,679
Int. Cl. H03k 17/00
U.S. Cl. 307—254 6 Claims

ABSTRACT OF THE DISCLOSURE

A constant-current transistor circuit including a first D.C. voltage source, a voltage-divider including at least two resistors connected in series between the first D.C. voltage source and the output terminal of the circuit, and a transistor connected as an emitter-follower to the voltage-divider with the base of the transistor being connected to the output terminal of the circuit and the emitter and collector electrodes of the transistor being connected in series between the junction of two of the voltage-divider resistors and a second D.C. voltage source.

BACKGROUND OF THE INVENTION

This invention relates to a transistor circuit for supplying a constant current to a variable resistance load, and in particular to such a circuit which is adapted for use in integrated circuit structures.

Constant-current transistor circuits for discrete components are known, as disclosed, for example, on pages 2–25 of the book "Selected Semiconductor Circuits Handbook," by S. Schwartz, published in 1961 by J. Wiley and Sons. Such a constant-current transistor circuit is shown in FIG. 1*a*. This circuit contains a transistor T1 connected as an emitter follower, with a base voltage divider R11, R12 and an emitter resistance R13. Between the collector and the supply voltage —V12 is a variable load L. The emitter voltage, except for the voltage drop of the emitter junction, follows the value of the base voltage. The current through the load L is thus determined in the normal modulation range of the circuit by the base voltage and the emitter resistance of transistor T1 but not by the respective resistance value of the load L. The circuit thus behaves, in conjunction with the supply voltage, as a source which, irrespective of the load impedance, acts as a constant current source. It has the special advantage of low dissipation in that the emitter resistance of the transistor can be kept low.

If the above-described circuit is used in integrated circuit form, however, a capacitance, which can not be neglected appears between the transistor collector and ground. The source of current (FIG. 1*a* becomes capacitive (condenser C) and is consequently not serviceable for feeding pulse circuits of very high frequency.

SUMMARY OF THE INVENTION

A main object of the present invention is to provide a constant-current transistor circuit in which the above-noted drawback is overcome.

Another object is to provide such a circuit which proprovides automatic transistor saturation protection.

These objects and others are carried out by providing a voltage-divider network containing at least two resistors connected in series between a first D.C. voltage source and an output terminal. A transistor is connected as an emitter-follower to the voltage-divider network with the base of the transistor being connected to the output terminal of the circuit and the emitter and collector of the transistor being connected in series between the junction of two of the voltage-divider resistors and a second D.C. voltage source. In the circuit of this invention the capacitance between the transistor collector and ground appears in parallel with the second D.C. voltage source and therefore does not adversely affect the high frequency response characteristics of the circuit when it is used in integrated circuit form.

DESCRIPTION OF THE PREFERRED EMBODIMENTS

Figure 2A:
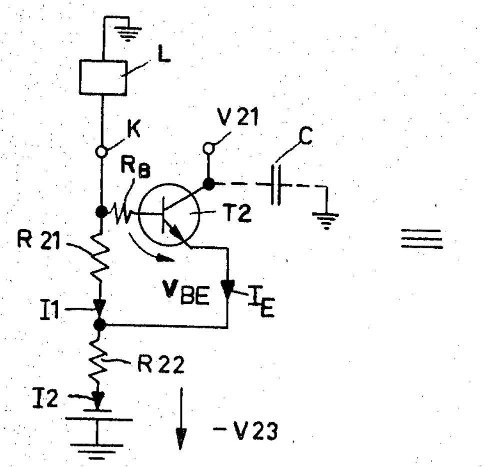
FIG. 2*a* is a schematic circuit diagram of one illustrative constant-current transistor circuit of this invention.

Referring to FIG. 2*a*, one illustrative constant-current transistor circuit of this invention comprises a voltage source —V23, resistances R21, R22 and a transistor T2. The positive terminal of the voltage source is grounded, while the negative terminal is applied via the resistances R22 and R21 to a load circuit L which is grounded at one end. The base of the transistor is connected to the output terminal K of the circuit; the emitter of the transistor is connected to the junction of resistors R21 and R22, and the collector of the transistor is connected to a bias voltage V21 which is more positive than output terminal K. The transistor acts in conjunction with the resistance R22 as an emitter-follower and the voltage drop $V_{BE}$ at the resistance R21 determines the modulation of the transistor.

Figure 3A:
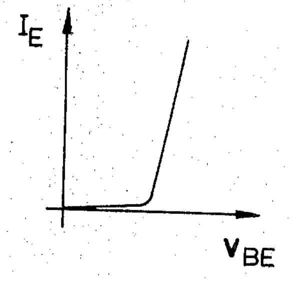
FIG. 3*a* is a first characteristic curve illustrating the operation of the embodiment shown in FIG. 2*a*.

The method of operation of the circuit is based on the steeply sloped base-emitter characteristic of the transistor, as shown in FIG. 3*a*, which transforms small variations of the base-emitter voltage $V_{BE}$ into large variations of the emitter current $I_E$. A variation in the voltage $V_{BE}$ produces a variation of the current $\Delta I_E$ in the same direction, which in turn produces a variation in the same direction in the voltage drop across resistance R22. The transistor T2 therefore causes a current flow into the voltage-divider consisting of the resistances R21 and R22, which is regulated as a function of the base-emitter voltage $V_{BE}$, in such a way that $V_{BE}$ varies as little as possible. Since the base current of transistor T2 is negligibly small compared with the current I1, a constant $V_{BE}$ across the resistance R21 means that a constant current flows through the load circuit.

Since the circuit acts as an emitter follower, the resistances R21 and R22 can be kept at low ohmic values to insure low power dissipation. The essential advantage of the circuit of this invention is, however, that the unavoidable capacity in integrated circuits between the collector of the transistor and ground is connected in parallel with the bias voltage source and is thus harmless for operation at high frequencies.

Every transistor has a certain amount of collector-base capacitance. In order to render this capacitance ineffective when the circuit is operated in the range of very high frequencies, it is preferably to utilize a not excessively high base series resistance $R_B$. A tested set of circuit resistance values is, for example, as follows: R21=50 ohms, R22=150 ohms, $R_B$=200 ohms, V21=0 volts and V23=6 volts.

To obtain a very high degree of current constancy, an additional regulation can be provided by connecting a further resistance between the resistances R21 and R22, and connecting a further transistor in parallel with the further resistance by the same connections as shown for T2 and R21. The regulating factor of the circuit as a whole will then be the product of the regulating factor of both transistor circuits.

Figure 3B:
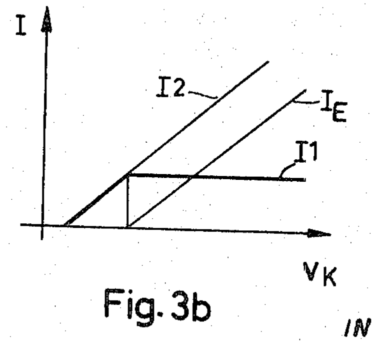
FIG. 3*b* is a second characteristic curve illustrating the operation of the embodiment shown in FIG. 2*a*.

FIG. 3*b* shows the curve of the currents I1, I2 and $I_E$, as a function of the voltage $V_K$ at the output terminal K. With increasing voltage $V_K$, I1 at first rises as a linear function of $V_K$ and then bends to form a horizontal curve which characterizes the regulating range of the circuit.

Figure 2B:
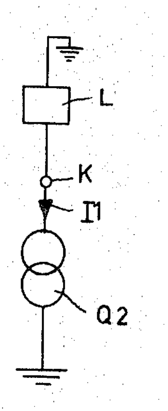
FIG. 2*b* shows a block diagram symbol for the circuit of FIG. 2*a*.
Figure 4A:
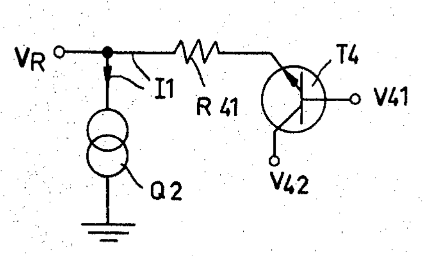
FIG. 4*a* is a schematic circuit diagram of a circuit of this invention for controlling a direct voltage in accordance with temperature.

With the constant-current source of FIG. 2*a*, which is symbolized by the block diagram symbol Q2 in FIG. 2*b*, it is possible to construct a simple circuit for controlling a direct voltage $V_R$ as a function of temperature. Such a circuit is shown in FIG. 4*a*. It comprises a constant-current source Q2 according to FIG. 2*a*, which is grounded and connected in parallel with a resistance R41 and the emitter-collector path of a transistor T4 to a working voltage V42. At the base of transistor T4, there is connected a voltage V41. Apart from the voltage drop at the emitter junction of T4, the emitter is also at the voltage V41.

With rising temperature, the curve of FIG. 3*a* shifts more and more to the left, parallel to itself (diode temperature behavior). The current I1 in the regulating range consequently becomes lower and lower. With decreasing I1, the voltage drop across resistance R41 likewise becomes less, so that the voltage $V_R$ moves further and further toward the voltage V41. With constant voltage at the emitter of the transistor T4, the voltage $V_R$ becomes more positive in the proportion of R41/R21 as the characteristic $I_E$–$V_{BE}$ of the emitter junction of the transistor T1 moves to the left with rising temperature. This effect is further intensified by the natural positive temperature coefficient of the resistance R21. The voltage $V_R$ thus controlled is particularly suitable for the temperature-compensating control of further transistor stages. A resistance ratio of R41=0.5R21 is advantageous in this circuit.

If the transistor T4 is exposed to the same ambient temperature as the constant-current source Q2, which is generally the case, and in particular in integrated circuits, the voltage $V_R$ undergoes a further variation in the same direction compared with the previous case, since the $I_E$–$V_{BE}$ ratio of the transistor T4 varies with temperature to the same degree as the source of current Q2.

Figure 4B:
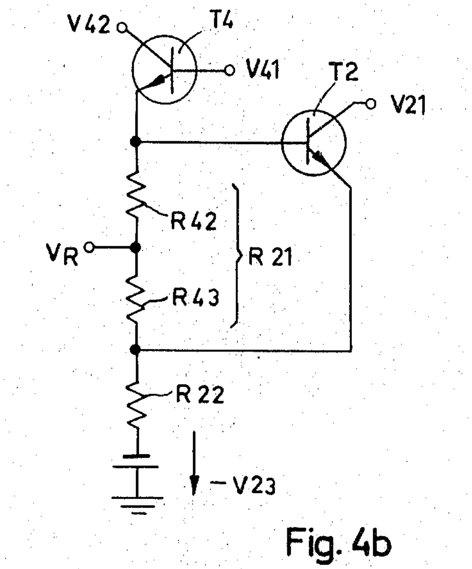
FIG. 4*b* is a schematic circuit diagram of a modification of the circuit of FIG. 4*a*.

The circuit arrangement of FIG. 4*a* can be modified as shown in FIG. 4*b* in such a way that the resistance R41 is omitted and the resistance R21 of the source of current Q2 is divided into two resistances R42 and R43 and the voltage $V_R$ is tapped at the junction of the two resistances R42 and R43. By the appropriate dimensioning of the two resistances R42 and R43, a voltage $V_R$ can be obtained in any desired divider ratio of the voltage $V_{BE}$ of transistor T2.

Figure 1A:
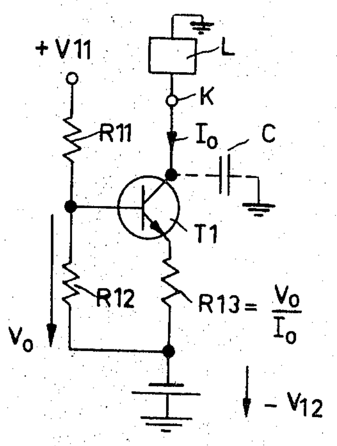
Fig. 1a (PRIOR ART)
FIG. 1*a* is a schematic circuit diagram of a prior art constant-current transistor circuit.
Figure 1B:
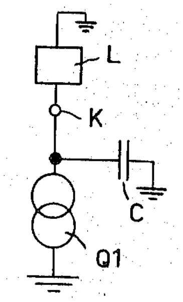
Fig. 1b (PRIOR ART)
FIG. 1*b* shows a block diagram symbol for the circuit of FIG. 1*a*.
Figure 5:
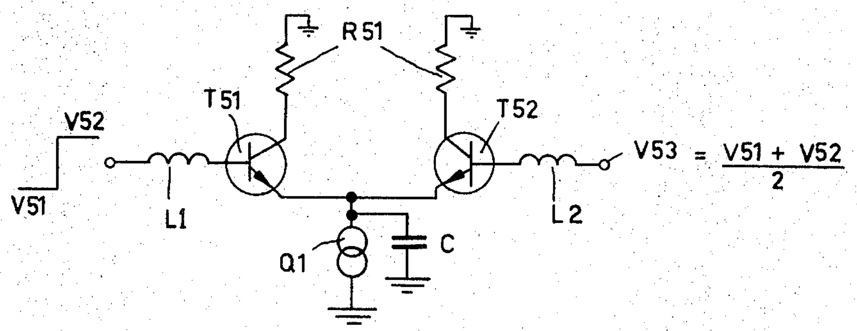
Fig. 5 (PRIOR ART)
FIG. 5 is a schematic circuit diagram of a prior art transistor switching circuit.

A particularly advantageous use of the constant-current source of this invention is in emitter-coupled transistor switch circuits. FIG. 5 shows a prior art form of such a switch circuit. It comprises two transistors T51 and T52, whose collectors are each coupled through a corresponding resistance R51 to ground and whose emitters are grounded through a prior art constant-current source Q1 of the type shown in FIG. 1*a*.

The base of transistor T51 is controlled optionally by the voltages V51 or V52. The base of transistor T52 is connected to a fixed voltage V53, which is between the control voltages V51 and V52 and is generally equal to $(V51+V52)/2$. In each case, the transistor whose base has the more positive voltage will conduct. The current furnished by the source of current Q1 is below the transistor saturation current. If this circuit arrangement is used in integrated form, the capacitance C again exists between the transistor collector and ground, which greatly reduces the usefulness of the whole circuit at high switching frequencies, inter alia because, in conjunction with the inductances L1 and L2 of the base supply leads, it causes the switching circuit to oscillate. This drawback is eliminated if the constant-current source Q1 is replaced by the constant-current source Q2 of this invention as shown in FIGS. 2*a* and 2*b*.

Figure 6:
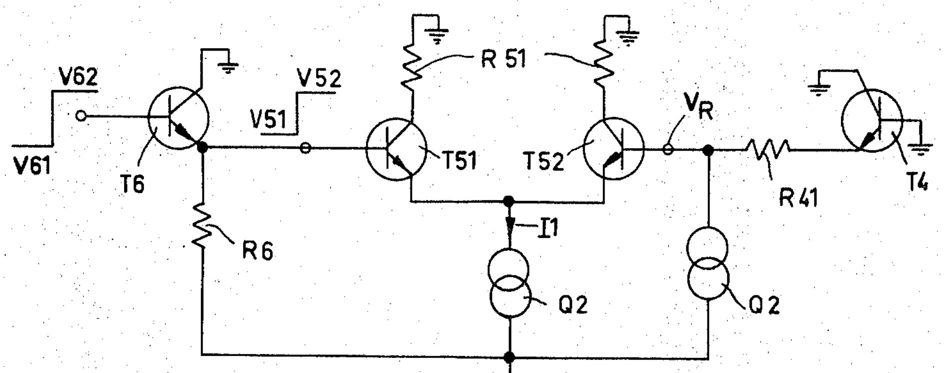
FIG. 6 is a schematic circuit diagram of a transistor switching circuit utilizing the circuits of FIG. 2*a* and FIG. 4*a*.

FIG. 6 shows the emitter-coupled switch of FIG. 5 as used in combination with the constant-current source of this invention. The transistor T51 is controlled through an emitter follower formed from a transistor T6 and a resistor R6 by the voltages V61 and V62. The voltages V51 and V52 each differ from V61 and V62 by the voltage drop across the emitter junction of the transistor T6.

The base of the transistor T52 is controlled by a circuit according to FIG. 4*a* with a voltage $V_R$. Here $V_R=(V51+V52)/2$. As has already been mentioned, the transistors T51 and T52 do not operate at their saturation point. The level of their control voltage is governed by this condition, for in emitter-coupled circuits as in FIG. 6, there is produced at the collector resistances R51 in each case a voltage drop of V62–V61=I1.R51, which is used directly for controlling the transistor T6 of an analogous circuit. For this reason V62=0 volt, V61=I1.R51. So that the difference in the base voltages of the transistors T51 and T52 is as large as possible for attaining a large interference distance, and since on the other hand, the collector-base voltage of the transistor T51 may not be charged negatively to avoid the overloading of this transistor, V51 is preferably made equal to the voltage drop of the emitter diodes of the transistors used. A negative collector-base voltage cannot, however, easily be prevented at the transistor T51, because the resistances R51 (and resistances in general) in integrated circuits have a positive temperature coefficient which cannot be neglected, and the base-emiter voltage of the transistors decreases with rising temperature (V51 and V52 then becomes more positive by the amount $\Delta$VBE).

This drawback occurs in the circuit according to FIG. 6 as long as the current supplied by the current source Q2 remains constant over the temperature. Nevertheless, as shown in connection with FIG. 4*a*, the current I1 supplied by the current source Q2 according to this invention likewise decreases with rising temperature. In this way there is a decrease in the voltage drop at the collector resistances R51, and the risk of the saturation of the transistor T51 in FIG. 6 is eliminated. If, in particular, the temperature coefficients of the resistances of the source of current Q2 and the collector resistances are equal, and likewise the temperature coefficient of the resistances are equal, and likewise the temperature coefficients of the transistors, there occurs a complete compensation of the effect as regards saturation which is described in the previous paragraph.

Since for working with as high interference intervals as possible the base voltage $V_R$ of the transistor T52 should always be $(V51+V52)/2$, this must also be regulated with the temperature in such a way that $V_R$ becomes more positive with rising temperature. This provides, as described in conjunction with FIG. 4*a*, the control circuit of this transistor. The said condition for $V_R$ is held accurately when the temperature coefficient of all the resistances and of all the transistors of the circuit component being considered are the same.

The use of the source of current Q2 according to the invention in emitter-coupled circuits therefore provides, together with freedom from capacity, the additional inventive effect of automatic transistor saturation protection. The same advantage, along with all the other advantages that have been explained, is obtained in all pulse circuits that are current-controlled with the current source according to the invention and are controlled across emitter followers.

The invention can also be used with equal success with its further developments in all current-controlled circuits constructed in particular by the integrated technique, as for example, in differential amplifiers.

It will be understood that the above description of the present invention is susceptible to various modifications, changes and adaptations, and the same are intended to be comprehended within the meaning and range of equivalents of the appended claims.

I claim:

1. A transistor circuit for supplying a constant output current to a variable resistance load connected to the output terminal of the circuit, comprising, in combination:

(a) a first D.C. voltage source;
(b) an output terminal;
(c) a voltage-divider including at least two resistors, said voltage divider being connected in series between said first D.C. voltage source and said output terminal;
(d) a second D.C. voltage source; and
(e) a transistor having base, collector and emitter electrodes, said base electrode being connected to said output terminal and said emitter and collector electrodes being connected in series between said second D.C. voltage source and the junction of said two voltage-divider resistors.

2. A constant-current transistor circuit as defined in claim 1 and further comprising a third resistor connected in series with the base electrode of said transistor for rendering the base-collector capacitance of the transistor ineffective.

3. A constant-current transistor circuit as defined in claim 1 and further comprising a third and a fourth D.C. voltage source and a second transistor having base, collector and emitter electrodes, the base electrode of said second transistor being connected to said third D.C. voltage source, the collector electrode of said second transistor being connected to said fourth D.C. voltage source, and a third resistor connected between the emitter electrode of said second transistor and said output terminal.

4. A constant current transistor circuit as defined in claim 1 and further comprising a third resistor, and a third and a fourth D.C. voltage source and a second transistor having base, collector and emitter electrodes, said third resistor being connected between said output terminal and said voltage divider, the base electrode of said second transistor being connected to said third D.C. voltage source, the collector electrode of said second transistor being connected to said fourth D.C. voltage source and the emitter electrode of said second transistor being connected to said output terminal.

5. An emitter-coupled transistor switch circuit comprising first and second transistors, each having base, emitter and collector electrodes, output circuit means coupled to the collector electrodes of said first and second transistors, input circuit means coupled to the base electrodes of said first and second transistors, the emitter electrodes of said first and second transistors being coupled together and a constant-current transistor circuit as defined in claim 1 coupled in series with the emitter electrodes of said first and second transistors.

6. A transistor circuit as defined in claim 1, wherein said second D.C. voltage source and said voltage divider resistors have values such that the voltage drop across the resistance in said voltage divider which is connected between said junction and the base of said transistor remains substantially constant, whereby the current flowing through a load connected to said output terminal remains constant even though the resistance of the load varies.

References Cited

UNITED STATES PATENTS

| | | | |
|---|---|---|---|
| 3,130,361 | 4/1964 | Ioakimidis | 307—297 X |
| 3,231,755 | 1/1966 | Pascal. | |

DONALD D. FORRER, Primary Examiner

B. P. DAVIS, Assistant Examiner

U.S. Cl. X.R.

307—270, 297